US008748943B2

(12) United States Patent
Gumaelius (10) Patent No.: US 8,748,943 B2
(45) Date of Patent: Jun. 10, 2014

(54) BIPOLAR JUNCTION TRANSISTOR WITH STAIR PROFILE

(71) Applicant: Fairchild Semiconductor Corporation, San Jose, CA (US)

(72) Inventor: Krister Gumaelius, Vaxholm (SE)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/629,174

(22) Filed: Sep. 27, 2012

(65) Prior Publication Data

US 2013/0020611 A1 Jan. 24, 2013

Related U.S. Application Data

(63) Continuation of application No. PCT/EP2011/054850, filed on Mar. 29, 2011.

(60) Provisional application No. 61/319,048, filed on Mar. 30, 2010.

(30) Foreign Application Priority Data

Mar. 30, 2010 (SE) ...................................... 1050298

(51) Int. Cl.
*H01L 29/66* (2006.01)

(52) U.S. Cl.
USPC ....... 257/197; 257/77; 257/565; 257/E31.009

(58) Field of Classification Search
USPC ............ 257/77, 197, 565, E31.069, E27.053, 257/47; 438/189, 309
See application file for complete search history.

(56) References Cited

U.S. PATENT DOCUMENTS

| 3,878,008 | A |   | 4/1975 | Gleason et al. |
|---|---|---|---|---|
| 5,236,547 | A | * | 8/1993 | Takahashi et al. ............ 438/498 |
| 5,281,500 | A | * | 1/1994 | Cathey et al. ..................... 430/5 |

(Continued)

FOREIGN PATENT DOCUMENTS

| EP | 0338110 A1 | 4/1988 |
|---|---|---|
| WO | 97/08754 A2 | 3/1997 |

(Continued)

OTHER PUBLICATIONS

Response to Written Opinion Filed for PCT Application PCT/EP2011/054850, filed Oct. 9, 2012, 9 pages.

(Continued)

*Primary Examiner* — Jarrett Stark
*Assistant Examiner* — Shahed Ahmed (57) ABSTRACT

A semiconductor device and a method of forming a structure in a target substrate for manufacturing a semiconductor device is provided. The method comprises the step of providing a masking layer on the target substrate and providing a stair-like profile in the masking layer such that the height of a step of the stair-like profile is smaller than the thickness of the masking layer. Further, the method comprises the step of performing anisotropic etching of the masking layer and the target substrate simultaneously such that a structure having a stair-like profile is formed in the target substrate. The semiconductor device comprises a target substrate including a first region made of a first type of semiconductor material and a second region made of a second type of semiconductor material.

20 Claims, 5 Drawing Sheets

(56) References Cited

U.S. PATENT DOCUMENTS

| | | | |
|---|---|---|---|
| 5,895,269 | A | 4/1999 | Wang et al. |
| 5,967,795 | A * | 10/1999 | Bakowsky et al. ............ 438/494 |
| 6,562,251 | B1 | 5/2003 | Jordan |
| 2008/0265311 | A1 | 10/2008 | Tang et al. |
| 2009/0023098 | A1 | 1/2009 | Jain et al. |
| 2009/0121319 | A1 | 5/2009 | Zhang et al. |
| 2009/0140438 | A1 | 6/2009 | Yamazaki et al. |
| 2010/0039865 | A1 | 2/2010 | Kidoh et al. |
| 2010/0117097 | A1 * | 5/2010 | Domeij .......................... 257/77 |

FOREIGN PATENT DOCUMENTS

| | | |
|---|---|---|
| WO | 98/34274 A1 | 8/1998 |
| WO | 2009/061340 A1 | 5/2009 |
| WO | 2009/079306 A1 | 6/2009 |
| WO | 2010/027990 A1 | 3/2010 |

OTHER PUBLICATIONS

Asano et al., "Control of Si Solid Phase Nucleation by Surface Steps for High-Performance Thin-Film Transistors", Japanese Journal of Applied Physics vol. 32, 1993, pp. 482-485.

International Preliminary Report on Patentability received for PCT Application No. PCT/EP2011/054850, mailed on Oct. 18, 2012, 5 pages.

Written Opinion of the International Searching Authority received for PCT Application No. PCT/EP2011/054850, mailed on Jul. 1, 2011, 5 pages.

International Search Report received for PCT Application No. PCT/EP2011/054850, mailed on Oct. 6, 2011, 4 pages.

Second Written Opinion of the International Searching Authority received for PCT Application No. PCT/EP2011/054850, mailed on Jun. 29, 2012, 6 pages.

Demand for International Preliminary Examination for PCT Application No. PCT/EP2011/054850, filed on Jan. 30, 2012, 14 pages.

* cited by examiner

BIPOLAR JUNCTION TRANSISTOR WITH STAIR PROFILE

CROSS REFERENCE TO RELATED APPLICATIONS

This application is a continuation of PCT Patent Application No. PCT/EP2011/054850, filed Mar. 29, 2011, entitled "Semiconductor Device And Method Of Forming A Structure In A Target Substrate For Manufacturing A Semiconductor Device," which claims priority to U.S. Provisional Application No. 61/319,048, filed on Mar. 30, 2010 and which also claims priority to Swedish Application No. 1050298-7, filed on Mar. 30, 2010, all of which are incorporated by reference herein in their entirety.

FIELD

The present invention relates to the field of semiconductor devices and semiconductor fabrication. In particular, the present invention relates to a semiconductor device and a method of forming a structure in a target substrate for manufacturing a semiconductor device.

BACKGROUND

In the field of semiconductor technology, the performance of semiconductor devices are continuously pushed to higher limits. However, for a specific type of semiconductor device, a tradeoff in the design of the semiconductor device may sometimes be required such that a characteristic of the semiconductor device is optimized instead of another. Such a tradeoff may arise because of the final application intended for the semiconductor device, wherein a characteristic may be preferred as compared to another, or may also arise because of limitations in the manufacturing of the semiconductor device.

Referring in particular to the example of a bipolar junction transistor (BJT) comprising a collector region, a base region and an emitter region, the critical characteristics representative of the performance of the BJT are the common emitter current gain, the specific on-resistance and the breakdown voltage. It is known that, for a specific doping concentration, the base region of the BJT is preferably as thin as possible in order to obtain a high current gain. However, the minimum thickness of the base region is limited by the so-called punch-through effect wherein, for a too thin base region, the depletion region at the base-collector boundary may meet the depletion region at the base-emitter boundary. The depletion region is a space charge region of the target substrate in which the semiconductor material is depleted of charge carriers. Under such conditions, the collector region is effectively short-circuited to the emitter region, and a large current flows between the collector region and the emitter region. Thus, for a specific doping concentration, the thickness of the base region is, on the one hand, preferably increased for increasing the electric breakdown voltage of the BJT and, on the other hand, preferably decreased for increasing the gain of the BJT.

Further, the above mentioned punch-through effect, wherein the BJT has virtually no base (or wherein the effective base width is operatively reduced to zero), may occur more easily (i.e. at a lower collector-base voltage) if there are defects at the boundary between the emitter region and the base region.

In the fabrication of a mesa etched BJT, or even other kinds of semiconductor devices comprising a mesa structure or the like, a critical processing step is plasma etching (or dry etching) which is used for forming a structure having vertical or near vertical side wall in a semiconductor material, e.g. silicon carbide (SiC). Dry etching is normally used to form the emitter region and to terminate the base-collector junction. However, dry etching at a vertical or near vertical side wall in a semiconductor material such as e.g. SiC may result in the formation of a trench at the base of the wall, which may deteriorate the functioning of the resulting semiconductor device. In the following, the formation of such a trench will be referred to as the "trench effect".

For a BJT, the formation of such a trench at the boundary between the base region and the emitter region may result in that the effective thickness of the base region is reduced and does not correspond to the initially intended thickness of the base region deposited or grown on the substrate, thereby resulting in that the distance for punch-through of a high electric field to the top surface (the emitter region) decreases. Thus, for reducing the punch through effect, the base region of the BJT has to be sufficiently thick, which, however, reduces the gain of the BJT. In addition, during subsequent high temperature annealing of the semiconductor device, the material close to the top surface may redistribute and may be transported to the trench. The material transport in combination with the trench may cause an uncontrolled doping and poor material quality in a sensitive part of the transistor (e.g. at the emitter/base junction), thereby degrading the performance of the BJT.

Thus, there is a need for providing new types of structure for semiconductor devices and/or new manufacturing methods that would alleviate at least some of the above-mentioned drawbacks and/or enable to provide semiconductor devices with improved characteristics.

SUMMARY

An object of the present invention is to alleviate the above disadvantages and drawbacks of the prior art and to provide an improved alternative to the above technique and prior art.

Generally, it is an object of the present invention to provide a semiconductor device with improved characteristics. Further, it is an object of the present invention to provide a method of forming a structure in a target substrate for manufacturing a semiconductor device that reduces the above mentioned punch-through effect.

These and other objects of the present invention are achieved by means of the method as defined in claim 1 and the semiconductor device as defined in claim 11. Preferred embodiment are defined in the dependent claims.

According to a first aspect of the present invention, there is provided a method of forming a structure in a target substrate for manufacturing a semiconductor device. The method comprises the step of providing a masking layer on the target substrate and the step of providing a stair-like profile in the masking layer such that the height of a step of the stair-like profile is smaller than the thickness of the masking layer. Further, the method comprises the step of performing anisotropic etching of the masking layer and the target substrate simultaneously such that a structure having a stair-like profile is formed in the target substrate.

The present invention is based on the understanding that etching of a vertical or near vertical wall of a structure in a target substrate may result in a trench at the base of such a wall, i.e. at the base of the structure (or, in other words, at the junction between the structure to be formed and the remaining part of the target substrate). In prior art methods, wherein the masking layer does not comprise a stair-like profile, etching is enhanced at the base of the structure to be formed such that a trench is formed. Using a masking layer having a stair-like profile, i.e. a plurality of steps having a height smaller than the thickness of the masking layer, a structure having a stair-like profile can be formed in the target substrate by performing anisotropic etching of the masking layer and the target substrate simultaneously. The simultaneous anisotropic etching of the masking layer and the target substrate (i.e. the masking layer is also etched while the target substrate is etched) enables the transfer (either in a near 1:1 reproduction or any other relationship depending on the etching selectivity between the masking layer and the target substrate) of the stair-like profile provided in the masking layer to the target substrate. The method of the present invention is advantageous in that it results in very little (or negligible) trench effect at each of the steps of the stair-like profile of the structure formed in the target substrate. Thus, there is very little (or negligible) trench effect at the base of the structure formed in the target substrate. The trench effect at a step of the stair-like profile of the structure to be formed in the target substrate is negligible, or at least reduced, because the height of the step at the base of which a trench may be formed, i.e. the height of the masking layer on top of the step to be formed and the height of the step being formed in the target substrate, is reduced as compared to prior art methods, wherein the height of the vertical (or near vertical) wall at the base of which a trench is formed corresponds to the total thickness of the masking layer and the height of the wall of the structure being formed in the target substrate.

Even though a negligible trench effect may occur at one or more steps of the stair-like profile formed in the target substrate, the trench effect is diminished due to the plurality of steps. In other words, the plurality of steps formed in the masking layer imply that each step becomes smaller and more shallow as compared to a profile having only one steep wall in the masking layer, such that the trench effect is suppressed or at least diminished.

Further, the simultaneous etching of the masking layer and the target substrate for forming the stair-like profile in the target substrate may result in that the top corner (or edge) of a step of the stair-like profile becomes rounded (smoother), which further reduces the trench effect at the base of the step. Indeed, for a step located close to the base of the structure, the masking layer is removed early during the anisotropic etching process and the initially sharp edge of the step becomes rounded while etching.

With the present invention, a method of forming a structure in a target substrate for manufacturing of a semiconductor device with reduced trench effect is provided. Applying the method of the present invention to, for instance, the manufacturing of a BJT, the risk of "punch-through" between the emitter and collector regions is reduced. Thus, the method of the present invention is advantageous in that it enables the manufacturing of semiconductor devices with improved characteristics. The need for tradeoff in the design of the semiconductor device, such as e.g. the determination of the thickness of the base region for a BJT, is reduced.

According to an embodiment, the structure formed in the target substrate comprises at least one side wall having a plurality of steps, which is advantageous in that, for the manufacturing of e.g. a BJT, it is sufficient if at least one side wall of the structure comprises the stair-like profile.

According to an embodiment, the height of a step of the stair-like profile in the masking layer may represent less than one third of the thickness of the masking layer. Using at least three steps, i.e. if the height of a step of the stair-like profile in the masking layer represents less than one third of the thickness of the masking layer, is advantageous in that the trench effect may be more effectively reduced.

According to an embodiment, the method of the present invention may comprise the steps of providing a top level layer on the masking layer and forming a pattern in the top level layer for defining the planar shape (or area) of the structure to be formed in the target substrate. With these steps, the outer dimensions of the structure to be formed in the target substrate, i.e. the dimensions of the base of the structure, may be determined. The top level layer may be a polymer layer, for example a photo resist layer, in which a pattern may be formed by optical photolithography, electron-beam lithography, X-ray lithography, ion-beam lithography, nanoimprint lithography, or any kind of lithography techniques of the semiconductor technology. Further, the deposition of a top level layer is advantageous in that it may serve for the step of providing a stair-like profile in the masking layer as described in the following.

Various processing techniques may be employed for forming a stair-like profile in a masking layer. According to an embodiment, the step of providing a stair-like profile in the masking layer may comprise a sequence of etching steps. In particular, the sequence may comprise isotropic and anisotropic etching steps. In the following, two advantageous alternatives for providing a stair-like profile in the masking layer are described.

According to a first alternative, the sequence may comprise an anisotropic etching step for selectively etching the masking layer along a (near) vertical direction (the material of the top level layer in which a pattern is formed being very little affected by the etching step), thereby forming (the vertical edge of) a step in the masking layer. The sequence may then further comprise an isotropic etching step for etching the material of the masking layer in all (or at least nearly all or at least not only vertical) directions, thereby etching the masking layer laterally under the top level layer. Followed by an additional anisotropic etching step for selectively etching the masking layer in a vertical direction, an additional step is formed in the masking layer. The sequence (of anisotropic etching step and isotropic etching step) for forming a step of the stair-like profile may then be repeated until the desired number of steps is obtained in the masking layer. According to the present embodiment, the height of a step of the stair-like profile may be defined by the parameters of the isotropic and anisotropic etching steps of the sequence, and the width of a step of the stair-like profile may be defined by the parameters of the isotropic etching step of the sequence.

According to a second alternative, the sequence may comprise an anisotropic etching step for selectively etching the masking layer in a (near) vertical direction (the material of the top level layer in which a pattern is formed being very little affected by the etching step), thereby forming a step in the masking layer. The sequence may then further comprise an isotropic etching step for etching the material of the top level layer in all (or at least nearly all or at least not only vertical) directions, thereby reducing the size (at least the lateral dimensions) of the top level layer. Followed by an additional anisotropic etching step for selectively etching the masking layer in a (near) vertical direction, an additional step is formed in the masking layer. The sequence (step for anisotropic etching of the masking layer and step of isotropic etching of the masking layer) for forming a step of the stair-like profile may be repeated until the desired number of steps has been obtained in the masking layer. According to the present embodiment, the sequence may comprise an anisotropic etching step for defining the height of a step of the stair-like profile in the masking layer and an isotropic etching step for reducing the area (or size) of the top level layer, thereby defining the width of a step of the stair-like profile in the masking layer via subsequent anisotropic etching of the masking layer.

The second alternative described above for providing a stair-like profile in the masking layer is advantageous in that the outer dimensions of the structure to be formed in the target substrate are defined by the initial outer dimensions of the pattern formed in the top level layer. The outer dimensions (or planar shape) of the structure are therefore more accurately defined, which is advantageous in view of e.g. subsequent processing (for example formation of metal contacts) for which the position of the structure on the target substrate is preferably known.

It will be appreciated that the parameters of the etching processes of a sequence may be varied to control the respective heights of the various steps of a stair-like profile formed in the masking layer. Advantageously, the height of the step arranged closest to the interface between the structure and the remaining part of the substrate, i.e. the height of the step of the stair-like profile forming the base of the structure, is well determined as it may comprise a critical electronic junction, e.g. the junction between a p-doped layer and an n-doped layer, of the semiconductor device. The height of the step may then be determined based on the respective thicknesses of the active layers of the semiconductor device.

Generally, a masking layer may be a hard mask, or the like, used in semiconductor processing to withstand an etching process during which the material underlying the hard mask is selectively more affected by the etching process than the hard mask. In the present application, with the term "selectivity" is meant the difference in etching rate between two different materials when subject to the same etching process.

According to an embodiment, the etching rate for forming the stair-like profile in the target substrate by anisotropic etching may be selected to be substantially the same in the target substrate and in the masking layer. Using substantially the same etching rate, the stair-like profile of the masking layer is transferred to the target substrate with a 1:1 ratio (or at least close to 1:1 ratio). The stair-like profile of the structure formed in the target substrate thus directly corresponds to the stair-like profile initially provided in the masking layer. Alternatively, the etching rate may be selected to be faster in the target substrate than in the masking layer, such as e.g. with a ratio of 2:1, 3:1, 4:1, or the like, thereby enhancing the stair-like profile in the target substrate as compared to the target profile provided in the masking layer. For example, with a 2:1 ratio, the height of a step of the stair-like profile formed in the target substrate is two times higher than the height of the corresponding step of the stair-like profile provided in the masking layer. Alternatively, the etching rate may be selected to be slower in the target substrate than in the masking layer, such as e.g. with a ratio of 1:2, 1:3, 1:4, or the like, thereby diminishing the height of a step of the stair-like profile in the target substrate as compared to the height of the corresponding step of the stair-like profile provided in the masking layer.

According to an embodiment, the masking layer may be a hard mask comprising a material selected from one or a combination of silicon dioxide ($SiO_2$) and silicon nitride ($Si_xNi_{1-x}$). Such materials are advantageous in combination with a target substrate made of, e.g., silicon or silicon carbide since both the masking layer and the target substrate can then be etched with the same kind of chemical species (same type of chemistry) an thus can be etched simultaneously.

According to a second aspect of the present invention, there is provided a semiconductor device comprising a target substrate including a first region made of a first type of semiconductor material and a second region made of a second type of semiconductor material. The first and second types of semiconductor material are different from one another and the first and second regions are adjacent such that an active region of the semiconductor device is formed. At the junction between the first and second regions, the semiconductor device comprises a structure having a stair-like profile.

The semiconductor device of the present invention is advantageous in that, using such a design, i.e. a structure with a stair-like profile arranged in an active region of the semiconductor device, the punch-through effect is reduced. Any trench effect that may occur at the base of the structure during manufacturing is reduced. For a bipolar junction transistor for instance, the thickness of the base region can then be selected more freely, i.e. the thickness may be relatively thin to achieve a high gain and still provide a relatively high breakdown voltage.

The semiconductor device may advantageously be obtained in a target substrate in accordance with a method as defined in any one of the above mentioned embodiments. As mentioned above, the trench effect at the base of the structure formed in the target substrate is reduced and, thus, the active region of such a semiconductor device suffers much less from the punch-through effect. As a result, a semiconductor device with improved characteristics may be provided.

According to an embodiment, the first region comprises p-doped material and the second region comprises n-doped material, or vice versa, thereby forming a pn-junction.

The first and second types of semiconductor material may differ in e.g. doping level or dopant atoms (thereby forming p-doped or n-doped active layers).

According to an embodiment, the semiconductor device may be one of the group comprising a bipolar junction transistor (BJT), a diode, a MOSFET transistor, a JFET transistor, a thyristor and an insulated gate bipolar transistor. Referring in particular to a BJT, with the present invention, the thickness of the base region may be decreased to a greater extent as compared to prior art BJTs, thereby increasing the current gain of the BJT while maintaining relatively high breakdown voltage.

According to an embodiment, the step of the stair-like profile forming the base of the structure (i.e. the step arranged closest to the interface between the structure and the remaining part of the target substrate) may comprise part of the first region and part of the second region, which e.g. may be the emitter region and the base region, respectively, of a bipolar transistor.

According to an embodiment of both the first or second aspect of the present invention, the target substrate is a semiconductor wafer or the like (i.e. a thin slice of semiconductor material) comprising a material selected from one or a combination of silicon carbide (SiC), silicon (Si), gallium arsenide (GaAs), indium phosphide (InP) and gallium nitride (GaN). The material of the target substrate is preferably suitable for various types of semiconductor processes such that a device may be manufactured.

In the present application, with the term "anisotropic" etching is meant an etching process which is direction sensitive, i.e. that the etching occurs preferentially along a specific direction or within a specific range of directions. Anisotropic etching offers substantial directionality and, normally, the etching proceeds more rapidly in a vertical direction than in a horizontal direction.

Further, in the present application, with the term "isotropic" etching is meant an etching process which is the same or nearly the same in all (or nearly all) directions.

Further, in the present application, with the term "vertical" or "near vertical" direction is meant a direction substantially normal to the surface of the target substrate.

Further, in the present application, for clarity purposes, the "base" or base layer of a transistor is referred to as the "base region" of the semiconductor device or the BJT while, in another (more architectural) context, the term "base" alone is sometime used to define the lower part or bottom of the structure.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which.

All the figures are schematic, not necessarily to scale, and generally only show parts which are necessary in order to elucidate the invention, wherein other parts may be omitted or merely suggested.

DETAILED DESCRIPTION

With reference to FIGS. 1a-1d, there is shown a process flow illustrating a method of forming a structure in a target substrate for manufacturing a semiconductor device in accordance with an exemplifying embodiment of the present invention.

Figure 1A:
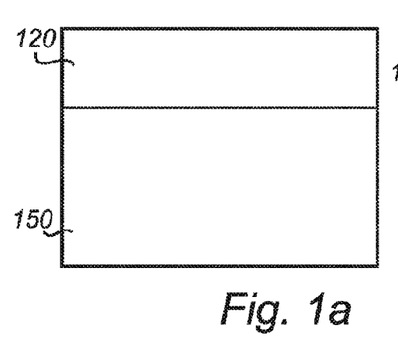
FIG. 1a-1d show a process flow illustrating a method of forming a structure in a target substrate in accordance with an exemplifying embodiment of the present invention.

FIGS. 1a-1d show a process flow 1000 illustrating an exemplifying embodiment of the method of the present invention wherein a masking layer 120 is provided on top of a target substrate 150 (FIG. 1a). The masking layer 120 may be deposited or grown on the target substrate 150. Deposition of the masking layer 120 on the target substrate 150 is however preferable as the target substrate may comprise a number of layers at its top surface intended to be used as active layers of the semiconductor device to be manufactured. Growth of the masking layer from the material of the target substrate would otherwise consume at least part of the target substrate and thereby the active layers already grown or deposited on top of it. Further, referring to processing in SiC in particular, it is normally preferable to deposit the masking layer on top of the target substrate as growth of e.g. an oxide as masking layer may lead to defects at the interface between the oxide and the target substrate.

Figure 1B:
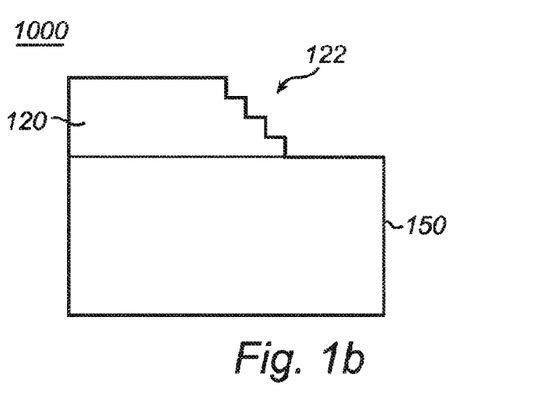

Further, the process flow 1000 comprises a step of providing a stair-like profile 122 in the masking layer 120 (FIG. 1b). Examples of process flows for providing the stair-like profile 122 in the masking layer 120 will be described with reference to FIGS. 2a-2d and 3a-3d in the following.

Figure 1C:
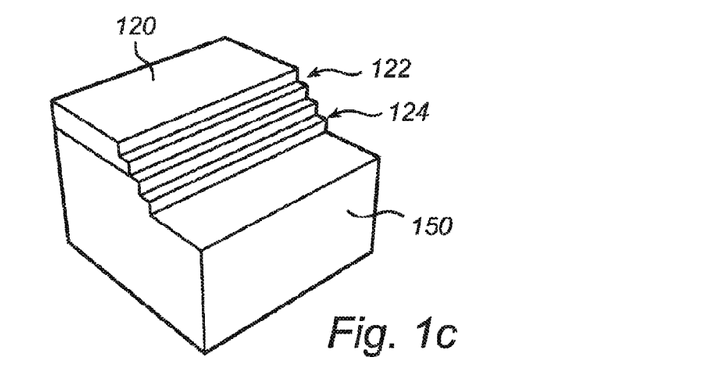
Figure 1D:
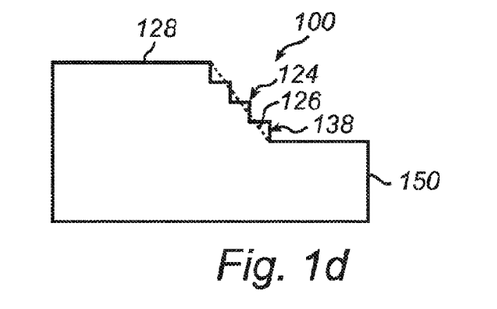

Further, the process flow 1000 comprises the step of performing anisotropic etching of the masking layer 120 and the target substrate 150 simultaneously (FIG. 1c). During anisotropic etching, any area of the target substrate 150 uncovered by the masking layer 120 (i.e. directly exposed to the chemical species used in the anisotropic etching process) is removed from the target substrate 150 and a hole is thereby formed in the target substrate 150 in such an area. Because of the directionality of anisotropic etching, vertical (or near vertical) side edges are not etched, or at least very little etched, thereby defining a hole with vertical (or near vertical) edges or side walls. A step of the stair-like profile 124 is thus formed in the target substrate 150. Further, as the masking layer 120 and the target substrate 150 are etched simultaneously and the masking layer 120 has a stair-like profile, areas of the target substrate 150 initially protected by the masking layer 120 at the beginning of the anisotropic etching process becomes subject to the anisotropic etching process (i.e. exposed to the chemical species used in the anisotropic etching process) later on during the anisotropic etching process. Material of the target substrate 150 is then removed in these areas. FIG. 1c is a three-dimensional view of the target substrate 150 and the masking layer 120 during the anisotropic etching wherein some of the steps of the stair-like profile provided in the masking layer 120 has been transferred to the target substrate but not all. Additional steps of the stair-like profile 124 can be formed in the target substrate 150 by further etching the masking layer 120 and the target substrate 150. As a result, a stair-like profile 124 comprising a plurality of steps is formed in the target substrate 150 (FIG. 1d).

The anisotropic etching process may preferably be selected to etch both the material constituting the masking layer 120 and the material constituting the target substrate 150 such that simultaneous etching of the masking layer 120 and the target substrate 150 is provided. In other words, the masking layer 120 and the target substrate 150 preferably have the same type of chemistry, i.e. that they can be etched with the same type of chemical species. An example may be a structure formed in a target substrate 150 made of SiC using a masking layer 120 made of $SiO_2$ and chemical species including gases such as e.g. $SF_6$ and $O_2$. It will be appreciated that the selection of the masking layer 120 and the selection of the etching process depends on the material of the target substrate 150. The material of the masking layer 120 is selected such that it can react to the same type of chemistry as the target substrate and the etching process is selected to provide the desired anisotropic etching in both the masking layer 120 and the target substrate 150. Referring in particular to SiC as semiconductor material, various chemical species are used for the various types of SiC (i.e. 3C—SiC, 6H—SiC or 4H—SiC react preferably with different types of chemical species).

The target substrate 150 may be a semiconductor wafer and the method of the present invention may be applied to any kind of semiconductor material including at least one of the group comprising silicon carbide (SiC), silicon (Si), gallium arsenide (GaAs), indium phosphide (InP) and gallium nitride (GaN).

For semiconductor materials such as e.g. silicon carbide (SiC) or Gallium Arsenide (GaAs), the anisotropic etching process is advantageously a dry etching process, which generally includes plasma etching, reactive ion etching (RIE), reactive ion-beam etching, sputter etching, inductively coupled plasma (ICP) etching, electron cyclotron resonance (ECR) etching and ion milling. Generally, these techniques are based on the interaction (physical and/or chemical) between the target substrate and the chemical species. Examples of reactive gases used for dry etching may be one or a combination of fluorocarbons, oxygen, chlorine, boron trichloride, and other gases. Using such kind of processes, the portions of the masking layer 120 and the target substrate 150 exposed to a bombardment of ions are removed (physically and/or chemically). The anisotropic etching process may also be a wet etching process if it can provide the required anisotropy. However, wet etching usually results in isotropic etching. Further, chemically resistant materials, such as SiC and GaAs, react very slowly to wet etching.

The etching rate for forming the stair-like profile in the target substrate by anisotropic etching may be selected to be substantially the same in the target substrate 150 and in the masking layer 120. In such conditions, the stair-like profile 122 of the masking layer 120 is transferred to the target substrate 150 in a one-to-one (1:1) ratio. The dimensions of the steps of the stair-like profile 124 formed in the target substrate 150 are therefore substantially the same as the dimensions of the steps of the stair-like profile 122 provided in the masking layer 120.

However, the etching rate for forming the stair-like profile 124 in the target substrate 150 by anisotropic etching may be selected to be faster for the target substrate 150 than for the masking layer 120. The difference in etching rate may be characterized by the so-called "selectivity" of the etching process, which may e.g. be represented by a ratio such as 2:1, 3:1, 4:1, or the like, or even a number such as 1.5 wherein the material of the target substrate 150 is etched 1.5 times faster than the material of the masking layer 120. In the present example, the selectivity of the etching process enhances the stair-like profile 124 formed in the target substrate 150. The steps of the stair-like profile 124 formed in the target substrate 150 are then more pronounced (higher dimensions) than the steps of the stair-like profile 122 provided in the masking layer 120.

Alternatively, the etching rate for forming the stair-like profile 124 in the target substrate 150 by anisotropic etching may be selected to be slower for the target substrate 150 than for the masking layer 120. The difference in etching rate may also be characterized by the selectivity of the etching process, which may e.g. be represented by a ratio such as 1:2, 1:3, 1:4, or the like, or even a number such as 0.33 wherein the material of the target substrate 150 is etched about three times slower than the material of the masking layer 120. In the present example, the selectivity of the etching process diminishes the topography of the stair-like profile 124 formed in the target substrate 150. The steps of the stair-like profile 124 formed in the target substrate 150 are less pronounced (smaller dimensions) than the steps of the stair-like profile 122 provided in the masking layer 120.

The selectivity of the etching process may be determined by the parameters of the etching process such as the type of chemical species, the pressure in the chamber where the etching process takes place, and the temperature. For an etching process based on inductively coupled plasma, the parameters may be the type of chemical species, the pressure in the chamber, the power applied to a coil used to accelerate the ions of the plasma towards the target substrate arranged on a so-called plate and the power applied to the plate. For illustration purposes, the following experimental data, i.e. an anisotropic etching process based on $SF_6$ as reactive gas in addition to Argon in a volume ratio of 3:1, a pressure of 5 mT, a coil power of 600 W and a plate power of 30 W, resulted in an etching rate of 100 nm/min for a target substrate made of SiC and an etching rate of 95 nm/min for a masking layer made of $SiO_2$. In these conditions, the etching rates for the masking layer and the target substrate are substantially the same and a stair-like profile having almost the same dimensions as the stair-like profile provided in the masking layer is formed in the target substrate.

The resulting structure formed in the target substrate 150 may be defined as a beveled structure (or mesa structure if it comprises more than one side walls) comprising a stair-like profile 124. In other words, the structure comprises at least one generally inclined side wall 126 having a stair like profile 124. The structure may also be defined by a substantially flat top surface 128 and at least one generally inclined side wall 126 including the stair-like profile 124 (FIG. 1d). Thus, although the angle between the step 130 of the stair like profile forming the base of the structure (i.e. the step located closest to the interface between the structure and the remaining part of the target substrate 150) and the remaining part of the target substrate 150 may be a right angle (or an angle near 90°) as seen at the local "step level", the side wall 126 of the structure may be generally inclined from the flat top surface 128 towards the base of the structure such that a stair-like profile may be formed.

Although FIG. 1d shows a structure comprising only one inclined side wall 126 having a stair-like profile, it will be appreciated that the structure may comprise more than one inclined side wall and that such additional inclined side wall may also comprise a stair-like profile. The structure may therefore be substantially symmetric (around a substantially vertical axis).

With reference to FIGS. 2a-2d, there is shown a process flow illustrating a method of providing a stair-like profile in a masking layer in accordance with an exemplifying embodiment of the present invention.

Figure 2A:
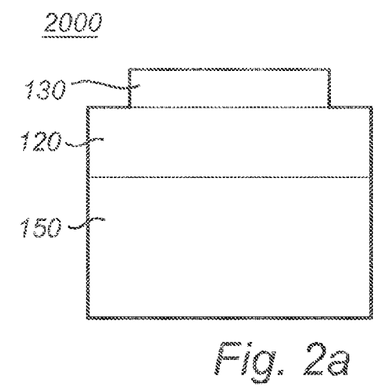
FIG. 2a-2d show a process flow illustrating a method of providing a stair-like profile in a masking layer in accordance with an exemplifying embodiment of the present invention.

FIGS. 2a-2d show a process flow 2000 illustrating an exemplifying embodiment of the method of the present invention wherein a top level layer 130 is provided on the masking layer 120 (FIG. 2a). The top level layer may for instance be a photo resist material which can be deposited on the masking layer (using standard spin-off technique). The top level layer 130 may then be patterned using lithography techniques such as optical photolithography, electron-beam lithography, X-ray lithography, ion-beam lithography or nanoimprint lithography. The pattern formed in the top level layer 130 defines the planar shape of the structure formed in the target substrate 150, i.e. defines the outer dimensions (or dimensions of the base) of the structure to be formed in the target substrate 150.

The process flow 2000 further comprises a sequence of etching steps. In the present embodiment, the sequence comprises steps for alternating between isotropic and anisotropic etching of the masking layer 120. The height of a step of the stair-like profile 122 of the masking layer 120 is then defined by the parameters of the isotropic and anisotropic etching steps of the sequence, and the width of a step of the stair-like profile 122 of the masking layer 120 is defined by the parameters of the isotropic etching step of the sequence.

Figure 2B:
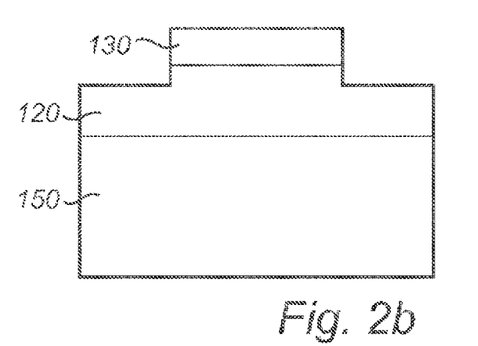

The process flow 2000 comprises an anisotropic etching step wherein any area of the masking layer 120 uncovered by the top level layer 130 is etched away, i.e. that material of the masking layer 120 is removed in these exposed areas (FIG. 2b). A (near) vertical edge or wall is then formed in the masking layer 120.

Figure 2C:
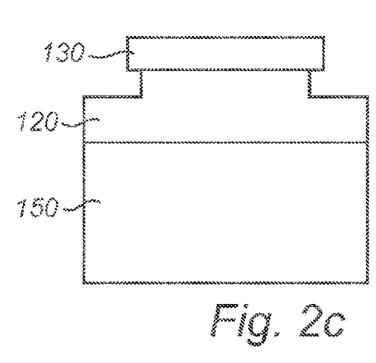

The process flow 2000 further comprises an isotropic etching step wherein the masking layer 120 is etched in (nearly) all directions, i.e. horizontally and vertically, including a region under the top level layer 130 (FIG. 2c). The previously formed vertical edge is thus shifted laterally under the top level layer 130.

Figure 2D:
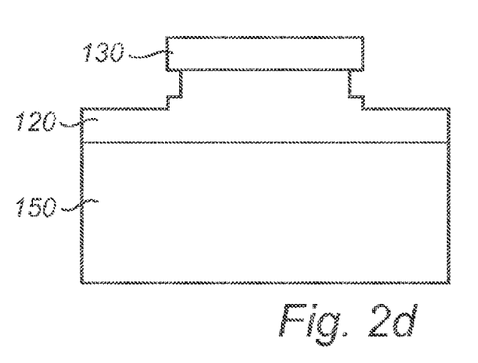

Further, the process flow 2000 may comprise an additional anisotropic etching step for forming an additional vertical edge or wall in the masking layer 120 (FIG. 2d). The anisotropic etching step performed in FIG. 2d is in principle equivalent to the anisotropic etching step described with reference to FIG. 2b. However, different parameters (particularly the etching time) may be used if the dimensions of the steps of the stair-like profile are to be different from one to another. A step is thus formed in the masking layer 120. The above sequence of anisotropic etching (FIG. 2b) and isotropic etching (FIG. 2c) may be repeated until a desired number of steps has been obtained in the masking layer 120.

Plasma etching may for instance be used for switching between anisotropic etching and isotropic etching of the masking layer 120. In a plasma etching process, the plasma generates reactive species that serve to chemically etch material in immediate proximity to the plasma. If the etching is completely (or nearly completely) chemical, the etching tends to be isotropic. However, the chemical reactions with the masking layer may be driven or enhanced by the kinetic energy of the incoming ions and in such case, the etching tends to be directional, i.e. anisotropic. Thus, by switching the parameters used during plasma etching, the etching process may be switched from isotropic etching to anisotropic etching and vice versa.

Referring to FIGS. 3a-3d, there is shown a process flow 3000 illustrating a method of providing a stair-like profile 124 in a masking layer 120 in accordance with another exemplifying embodiment of the present invention.

Figure 3A:
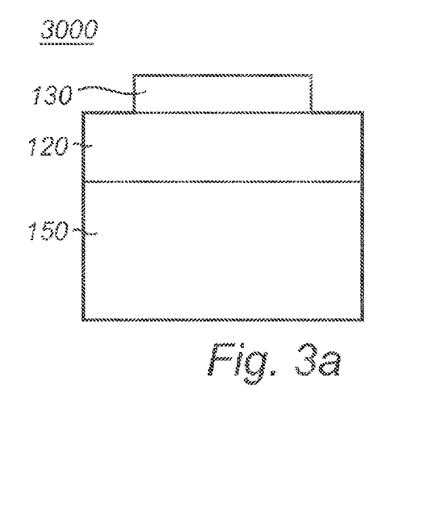
FIG. 3a-3d show a process flow illustrating a method of providing a stair-like profile in a masking layer in accordance with another exemplifying embodiment of the present invention.

FIGS. 3a-3d show a process flow 3000 illustrating another exemplifying embodiment of the method of the present invention wherein a top level layer 130 is provided on the masking layer 120 (FIG. 3a). The top level layer 130 is equivalent and may be provided in an equivalent manner as the top level layer 130 described with reference to FIG. 2a. A pattern is formed in the top level layer 130 for defining the planar shape (or outer dimensions) of the structure to be subsequently formed in the target substrate 150.

Figure 3B:
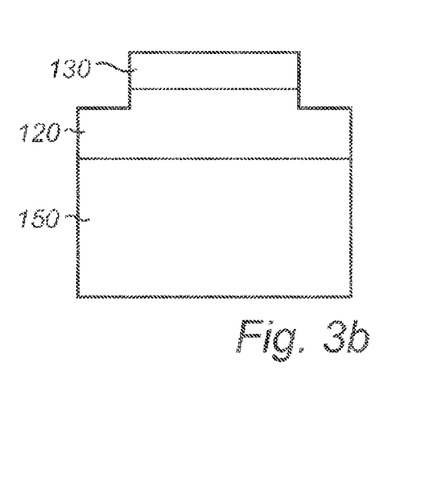

The process flow 3000 further comprises a sequence of etching steps. In the present embodiment, the sequence comprises an anisotropic etching step for etching the masking layer 120 and defining the height of a step of the stair-like profile 122 in the masking layer 120. A (near) vertical wall or edge is thereby formed in the masking layer 120 (FIG. 3b). The anisotropic etching is selected such that it preferably etches away the masking layer 120 and does not affect (or at least negligibly affect) the top level layer 130.

Figure 3C:
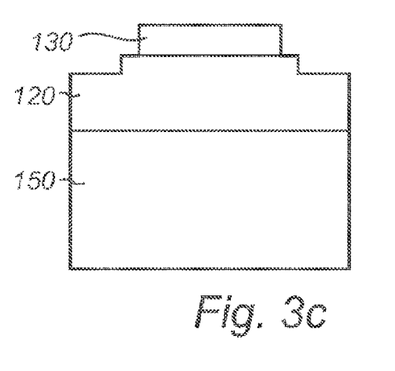

Further, the sequence comprises an isotropic etching step for reducing the size of the top level layer 130 (FIG. 3c). The isotropic etching is selected such that it preferably etches away (part of) the top level layer 130 and does not affect (or at least very little) the masking layer 120. The reduction of the size (width) of the top level layer 130 defines the width of the next step of the stair-like profile to be formed in the masking layer 120. As the reduction of the width of the top level layer 130 is performed by isotropic etching, the height of the top level layer is also reduced. Thus, the initial thickness of the top level layer 130 deposited on the masking layer 120 is preferably determined by the desired number of steps of the stair-like profile and their respective sizes.

Figure 3D:
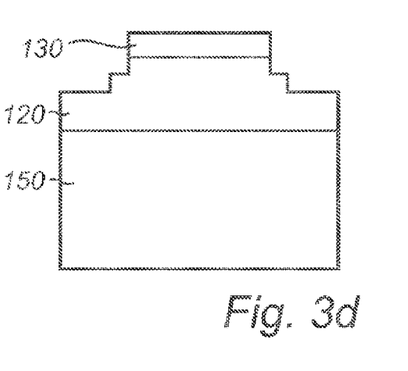

The process flow 3000 further comprises a subsequent anisotropic etching step of the masking layer 120 such that an additional (near) vertical wall or edge is formed in the masking layer 120. A step is thereby formed in the masking layer 120 (FIG. 3d). The above sequence (FIGS. 3b and 3c) may then be repeated until a desired number of steps has been obtained in the masking layer 120.

The stair-like profile 122 provided in the masking layer 120 comprises a plurality of steps, i.e. a succession of substantially vertical and horizontal edges.

The stair-like profile 122 in the masking layer 120 may advantageously be formed using dry etching processes instead of wet etching processes as dry etching processes provide a more accurate position of the step forming the base of the structure. Subsequent positioning of other layers (or contacts) on the target substrate is thereby facilitated. In contrast, wet etching generally results in over-etching and structures with less well defined edges.

For a normal thickness of a few microns for a grown or deposited masking layer, the number of steps of the stair-like profile in the masking layer may be comprised in the range of 2-100, preferably in the range of 3-50 and, even more preferably, in the range of 5-30. The desired number of steps may vary as a function of the total thickness of the masking layer. More specifically, the height of a step (of the stair-like profile provided in the masking layer or the stair-like profile formed in the target substrate) is advantageously designed to be less than about 300 nm. Indeed, even with a rather vertical edge, the trench effect appears to be negligible if the height of a step is less than 100 nm. In addition, the edge or top corner of a step may become rounded under the anisotropic etching process (because of ion bombardment), thereby further reducing the trench effect. Thus, very little trench effect is also observed for a step having a height of less than 300 nm, preferably less than about 200 nm.

For example, for a 1 micrometer thick masking layer of $SiO_2$ deposited on a SiC target substrate, a stair-like profile with about 20 steps may be realized. In the present example, the number of steps may preferably be comprised in the range of 5 to 30.

It will be appreciated that the various steps of the stair-like profile formed in the target substrate (or the masking layer) may vary in size, i.e. two steps of the stair-like profile may not necessarily have the same height and/or the same width. The step forming the base of the structure may for instance advantageously be slightly wider and higher than subsequent steps (closer to the top of the structure).

In the process flows described above, the masking layer 120 may be a hard mask comprising a material selected from one or a combination of silicon dioxide ($SiO_2$) and silicon nitride ($Si_xNi_{1-x}$), which are examples of material compatible with e.g. silicon and silicon carbide target substrate. However, the material of the masking layer is not necessarily limited to these specific examples.

Figure 4:
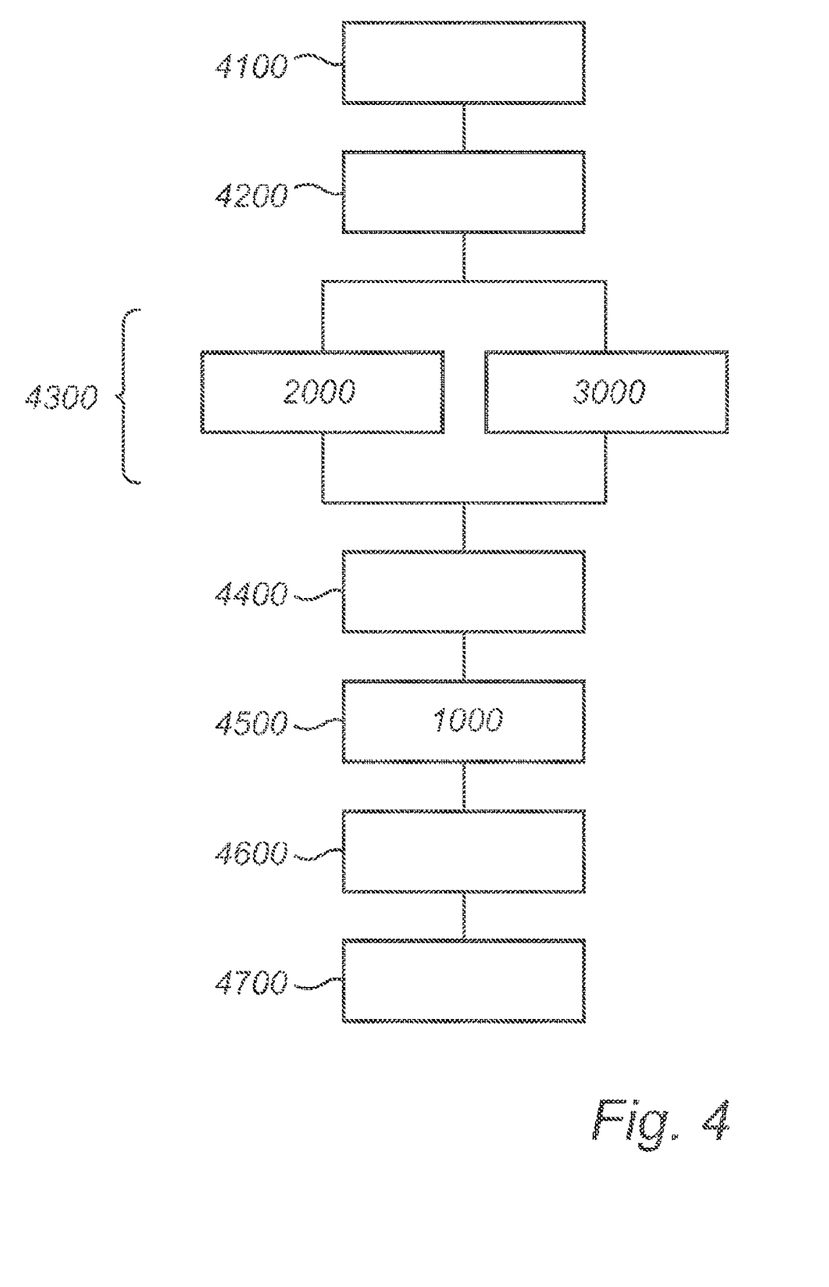
FIG. 4 shows a flow diagram of a method of forming a structure in a target substrate in accordance with an exemplifying embodiment of the present invention.

Referring to FIG. 4, there is shown a flow diagram of a method of forming a structure in a target substrate in accordance with an exemplifying embodiment of the present invention. Although details and parameters for the technological processes used for each of the steps of the flow diagram are cited as examples in the following, it will be appreciated that the method of the present invention is not limited to such details and parameters and that they are only provided as illustrative purposes. The various parameters of the processes may be selected in view of the desired structure to be formed or the desired semiconductor device to manufacture.

FIG. 4 shows a flow diagram 4000 wherein the starting material or target substrate 150 is a wafer made of semiconducting material (e.g. SiC). A number of active layers may have been previously grown or deposited on top of the target substrate 150.

In a first step 4100 of the flow diagram 4000, a masking layer 120 is provided on the target substrate 150. As an example, the masking layer 120 may be an about 1200 nm thick layer of $SiO_2$ deposited on the target substrate 150 by plasma enhanced chemical vapor deposition (PECVD).

Then, at step 4200 a top level layer 130, e.g. a photo resist, is provided on the masking layer 120. The top level layer is then patterned to define the planar shape of the structure to be subsequently formed in the target substrate 150. For example, an about 2000 nm thick photo-resist layer may be deposited on the masking layer 120. Followed by standard sub-steps comprising exposure, development and hard bake of the photo-resist layer, a pattern may be formed in the photo-resist layer.

At step 4300, the masking layer is processed to provide a stair-like profile in the masking layer, e.g. in accordance with the process flow 2000 described with reference to FIGS. 2a-2d or the process flow 3000 described with reference to FIGS. 3a-3d. For example, using the process flow 3000 described with reference to FIGS. 3a-3d, a first step of the stair-like profile 122 having a height of about 166 nm may be formed in the masking layer 120 using a reactive ion etching (RIE) process wherein the plasma comprises $CHF_3$ as reactive gas in combination with $O_2$, the pressure is about 50 mT and the power is about 125 W, thereby achieving an etching rate of about 37 nm/min. A first step of the stair-like profile may thereby be provided. Then, a sequence comprising an isotropic RIE process for reducing the size of the photo-resist layer by about 100 nm in a lateral (horizontal) direction may be performed using $O_2$ as active gas, a pressure of 200 mT and a power of 45 W, thereby achieving an etching rate of about 50 nm/min. The sequence may also comprise an anisotropic RIE process for etching a vertical step of 110 nm in the masking layer of $SiO_2$ using $CHF_3$ as reactive gas in combination with $O_2$ in a volume ratio of 10:1, a pressure of 50 mT, a power of 125 W, thereby achieving an etching rate of about 37 nm/min. For a 110 nm high step, the anisotropic etching step lasts for a period of about 3 minutes. The sequence may be repeated three times, thereby forming three additional steps in the masking layer 120.

Another subsequent sequence comprising an isotropic RIE process for etching of the photo-resist layer and an anisotropic RIE process for etching of the masking layer may be performed with different parameters. Alternatively, only the parameters (or some of the parameters) of one of the etching steps of the sequence may be changed. In the present example, the etching time for the anisotropic RIE process may be changed from 3 to 4 minutes such that an about 150 nm high step is formed in the masking layer of $SiO_2$ (instead of about 110 nm as in the previous sequence). This second sequence may be repeated five times, thereby forming five additional steps in the masking layer 120.

After the stair-like profile 122 is formed in the masking layer 120, the remaining part of the top level layer 130 may optionally be removed from the masking layer 120 at step 4400. For example, the remaining photo-resist layer may be removed by ashing (i.e. etching) in $O_2$.

At step 4500, the target substrate 150 and the masking layer 120 are processed in accordance with the process flow 1000 described above with reference to FIGS. 1a-1d, thereby resulting in a structure with a stair-like profile 124 formed in the target substrate 150. Even the parameters of the example described above in connection with FIGS. 1a-1d may be used for transferring the stair-like profile provided in the masking layer 120 to the target substrate 150, i.e. an anisotropic etching process based on inductively coupled plasma using $SF_6$ as reactive gas in combination with Argon in a volume ratio of 3:1, a pressure of 5 mT, a coil power of 600 W and a plate power of 30 W (resulting in an etching rate of 100 nm/min for SiC and an etching rate of 95 nm/min for $SiO_2$) for a period of 10 minutes, thereby etching about 1000 nm.

Optionally, at step 4600, the remaining part of the masking layer 120 may be removed from the target substrate 150. Using a masking layer made of $SiO_2$ as in the present example, the remaining part of the masking layer 120 may be removed by wet etching, e.g. in an aqueous (buffered) hydrofluoric solution (BHF or HF).

At step 4700, the target substrate (with its structure) may be annealed at high temperature for activating the dopant atoms of the active layers of the target substrate 150. Annealing is advantageous in that the stair-like profile 124 of the structure formed in the target substrate 150 becomes more smooth.

Figure 5:
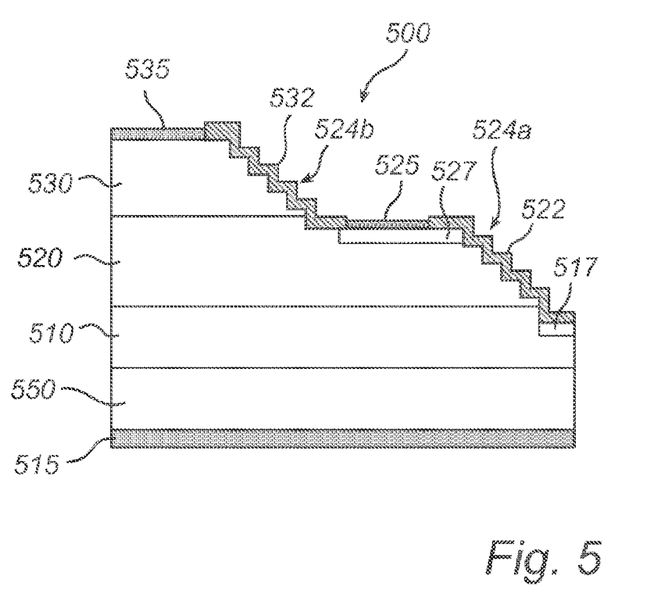
FIG. 5 shows a schematic cross-section of a vertical bipolar junction transistor as an exemplifying embodiment of a semiconductor device of the present invention. The semiconductor device is obtainable in accordance with a method of the present invention.

With reference to FIG. 5, there is shown a schematic cross-section of a semiconductor device in accordance with an embodiment of the present invention.

Generally, the semiconductor device 500 comprises a target substrate 550 including a first region 520 made of a first type of semiconductor material and a second region 530 made of a second type of semiconductor material. The first and second types of semiconductor material are different from one another and the first and second regions 520 and 530 are arranged adjacent to each other for forming an active region of the semiconductor device. At the junction between the first and second regions 520 and 530, the semiconductor device comprises a structure having a stair-like profile. The first region may comprise p-doped material and the second region may comprise n-doped material, or vice versa.

More specifically, FIG. 5 shows a schematic cross-section of a vertical (NPN) bipolar junction transistor 500 in accordance with an embodiment of the present invention. The vertical (NPN) bipolar transistor 500 comprises a collector region 510, a base region 520 and an emitter region 530 arranged on a target substrate 550, the base region 520 being arranged between the collector region 510 and the emitter region 530. The vertical (NPN) bipolar junction transistor 500 comprises also a collector contact 515 for electrically connecting the collector region 510, a base contact 525 for electrically connecting the base region 520 and an emitter contact 535 for electrically connecting the emitter region 530.

In an exemplifying but non-limited embodiment, a low-resistive n-type doped 3-inch or 4-inch wafer of 4H—SiC may be used as starting material. The device process is based on an epitaxially grown NPN structure wherein the collector region 510 is made of n-doped semiconductor material, the base region 520 is made of p-doped semiconductor material and the emitter region 530 is made of n-doped semiconductor material. For example, a 1200 V rated SiC BJT will preferably have a collector region 510 with a doping concentration in the mid $10^{15}$ $cm^{-3}$ range and a thickness in the range of 10-20 μm. For the base region 520, the base doping may be in the mid $10^{17}$ $cm^{-3}$ range and the thickness in the range of 300 nm to 1 μm. For the emitter region 530, the emitter doping may be in the order of $10^{19}$ $cm^{-3}$ and the thickness in the range of 500 nm to 2 μm.

One of the above described embodiments of the method of the present invention may be used to form the structure comprising the emitter region 530, the base region 520 and the collector region 510, i.e. to design the emitter-base junction and to terminate the base-collector junction. A NPN vertical junction transistor comprises two pn junctions, one at the boundary between the collector region 510 and the base region 520 and another one at the boundary between the base region 520 and the emitter region 530, which are two sensitive (active) regions of a bipolar junction transistor. It is thus preferable to reduce the trench effect in these regions. A first structure comprising a stair-like profile 524a may be formed in the target substrate at the boundary between the collector region 510 and the base region 520 and a second structure comprising a stair-like profile 524b may be formed in the target substrate at the boundary between the base region 520 and the emitter region 530. The two structures may be formed in the semiconductor device 500 in accordance with any one of the exemplifying embodiments of the present invention described above.

Two separate steps of aluminum ion implantation may subsequently be used to provide low-resistive base contacts, and to form a junction termination extension (JTE) with high voltage blocking capability. The JTE implantation dose is preferably in the order of $10^{13}$ cm$^{-2}$ to obtain improved blocking capability. Annealing for activation of implanted dopant atoms may be performed at temperatures in the range of 1600° C. to 1700° C. Surface passivation of the stair-like profile 524a (see layer 522 in FIG. 5) formed at the boundary between the collector region 510 and the base region 520 and of the stair-like profile 524b (see layer 532 in FIG. 5) formed at the boundary between the base region 520 and the emitter region 530 may be fabricated by thermal oxidation of SiC under improved conditions for achieving low defect concentrations at the interface between SiC and the SiO$_2$ surface passivation layer.

Ohmic contacts may be fabricated to the n-type doped emitter and collector regions 510 and 530 by depositing nickel followed by annealing at a temperature in the range of 800-1100° C. An ohmic contact to the p-type base region 520 may be fabricated by annealing an alloy consisting of Aluminum (Al), at temperatures in the same range as that used for formation of the nickel contacts. Al may be deposited on top of the base and emitter contacts 525 and 535, respectively, for reducing the series resistance in the metallization and allowing wire bonding to the top side of the chip. A metal system comprising nickel and gold may be deposited to the backside of the chip to make it compatible with conventional die attach technology.

As illustrated in FIG. 5, the structure obtained in the target substrate 550 in accordance with any one of the exemplifying embodiments of the present invention described above may act as an active region of the semiconductor device 500. In the present example, the step of the stair-like profile 524b forming the base of the structure comprises part of the emitter region 530 and part of the base region 520. Applying the method of the present invention for manufacturing such a BJT 500, very little trench effect is obtained at the base of the structure and the punch through effect is reduced. Designing a semiconductor device such as a BJT with a structure comprising a stair-like profile at the junction between two active layers (pn junction) is therefore advantageous. Consequently, with the present invention, a BJT may be designed with a thin base region such that a high gain is achieved while, at the same time, the electrical breakdown of the BJT is maintained at a high level.

More generally, the step of the stair-like profile 124 forming the base of the structure may comprise a layer made of a first type of semiconductor material and part of a layer made of a second type of semiconductor material. For a diode, the first type of semiconductor material may be a p-doped layer while the second type of semiconductor material may be a n-doped material.

It will be appreciated that the height of the step at which a pn junction is formed may preferably be well controlled. In the present example, the first step of the structure (i.e. the step forming the base of the structure, located closest to the interface between the structure and the remaining part of the target substrate) comprises a pn junction at the boundary between the base region 520 and the emitter region 530.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

For example, although reference is often made to SiC in the present application, the target material may be any kind of semiconductor material. The use of SiC is, however, advantageous for the manufacturing of power switching devices because of its high breakdown electric field, high thermal conductivity and high saturated drift velocity of electrons. SiC is a wide bandgap semiconductor and may advantageously be used for manufacturing devices for high power, high temperature and high frequency applications.

Further, although the present invention has been described with reference to a vertical NPN bipolar transistor, for which the method of the present invention is particularly advantageous in that it reduces the trench effect and thereby the punch-through effect, the present invention may also be applied for manufacturing of semiconductor devices such as a diode, a MOSFET transistor, a JFET transistor, a thyristor, an insulated gate bipolar transistor, or the like.

What is claimed is:

1. A bipolar junction transistor, comprising:
a target substrate including a base region made of a first type of semiconductor material, the target substrate including a collector region and an emitter region made of a second type of semiconductor material different from the first type of semiconductor material,
the base region and the emitter region being adjacent and defining an active region of the bipolar junction transistor; and
a structure having a stair profile including a plurality of steps at a junction between the base region and the emitter region.

2. The bipolar junction transistor of claim 1, wherein the base region includes a p-doped material and the emitter region includes an n-doped material, or vice versa.

3. The bipolar junction transistor of claim 1, wherein a step from the plurality of steps of the stair profile defining a base of the structure includes a part of the base region and a part of the emitter region.

4. The bipolar junction transistor of claim 1, wherein the target substrate includes at least one of silicon carbide (SiC), silicon (Si), gallium arsenide (GaAs), indium phosphide (InP) and gallium nitride (GaN).

5. The bipolar junction transistor of claim 1, wherein a height of a step from the plurality of steps of the stair profile is less than 200 nm.

6. The bipolar junction transistor of claim 1, wherein a number of steps included in the plurality of steps is greater than 4.

7. A bipolar junction transistor, comprising:
a target substrate including a base region made of a first type of semiconductor material, the target substrate including a collector region and an emitter region made of a second type of semiconductor material different from the first type of semiconductor material,
the base region and the emitter region being adjacent and defining an active region of the bipolar junction transistor; and
a structure having a stair profile at a junction between the base region and the emitter region, the stair profile having a first step and a second step, the first step defining a base of the structure, the first step including a part of the base region and a part of the emitter region.

8. The bipolar junction transistor of claim 7, wherein the structure includes a side wall having a plurality of steps including at least the first step and the second step.

9. The bipolar junction transistor of claim 7, wherein the structure includes more than one side wall having a plurality of steps.

10. The bipolar junction transistor of claim 7, wherein the step of the stair profile has a height less than 100 nm.

11. The bipolar junction transistor of claim 7, wherein the first step has a size different than a size of the second step.

12. The bipolar junction transistor of claim 7, wherein first step of the stair profile has a width greater than a width of the second step of the stair profile, the second step of the stair profile is closer to a top of the structure than the first step of the stair profile.

13. The bipolar junction transistor of claim 7, wherein first step of the stair profile has a height greater than a height of the second step of the stair profile, the second step of the stair profile is closer to a top of the structure than the first step of the stair profile.

14. The bipolar junction transistor of claim 7, wherein the bipolar junction transistor is a vertical bipolar junction transistor.

15. The bipolar junction transistor of claim 7, wherein the structure has a stair profile including more than two steps.

16. A bipolar junction transistor, comprising:
a base region made of a first type of semiconductor material;
a collector region made of a second type of semiconductor material different from the first type of semiconductor material;
an emitter region adjacent to the base region and made of the second type of semiconductor material, the emitter region and the base region defining at least a portion of an active region of the bipolar junction transistor; and
a structure having a stair profile including a plurality of steps at a junction between the base region and the emitter region.

17. The bipolar junction transistor of claim 16, wherein a step from the plurality of steps of the stair profile includes a part of the base region and a part of the emitter region.

18. The bipolar junction transistor of claim 16, wherein the bipolar junction transistor includes at least one of silicon carbide (SiC), silicon (Si), gallium arsenide (GaAs), indium phosphide (InP) and gallium nitride (GaN).

19. The bipolar junction transistor of claim 16, wherein a height of a step from the plurality of steps of the stair profile is less than 200 nm.

20. The bipolar junction transistor of claim 16, wherein the bipolar junction transistor is a vertical bipolar junction transistor.

* * * * *